US008756543B2

(12) United States Patent
Paruthi et al.

(10) Patent No.: US 8,756,543 B2
(45) Date of Patent: Jun. 17, 2014

(54) VERIFYING DATA INTENSIVE STATE TRANSITION MACHINES RELATED APPLICATION

(75) Inventors: Viresh Paruthi, Austin, TX (US); Peter Anthony Sandon, Vermont, VT (US); Jun Sawada, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 82 days.

(21) Appl. No.: 13/097,171

(22) Filed: Apr. 29, 2011

(65) Prior Publication Data

US 2012/0278773 A1     Nov. 1, 2012

(51) Int. Cl.
*G06F 9/455*     (2006.01)
*G06F 17/50*     (2006.01)

(52) U.S. Cl.
USPC ............ 716/106; 716/101; 716/107; 716/136

(58) Field of Classification Search
USPC ........................................................ 716/106
See application file for complete search history.

(56) References Cited

U.S. PATENT DOCUMENTS

| 6,141,633 A * | 10/2000 | Iwashita et al. ................. 703/15 |
| 2003/0004926 A1 * | 1/2003 | Ben-David ........................ 707/1 |
| 2006/0179383 A1 * | 8/2006 | Blass et al. ..................... 714/738 |
| 2010/0088526 A1 * | 4/2010 | Kumar et al. ................. 713/193 |

* cited by examiner

*Primary Examiner* — Paul Dinh
*Assistant Examiner* — Bryce Aisaka
(74) *Attorney, Agent, or Firm* — Garg Law Firm, PLLC; Rakesh Garg; Parashos Kalaitzis

(57) ABSTRACT

A method, system, and computer program product for verification of a state transition machine (STM) are provided in the illustrative embodiments. The STM representing the operation of a circuit configured to perform a computation is received. A segment of the STM is selected from a set of segments of the STM. A set of properties of the segment is determined. The set of properties is translated into a hardware description to form a translation. The segment is verified by verifying whether all relationships between a pre-condition and a post condition in the translation hold true for any set of inputs and any initial state of a hardware design under test. A verification result for the segment is generated. Verification results for each segment in the set of segments are combined to generate a verification result for the STM.

20 Claims, 4 Drawing Sheets

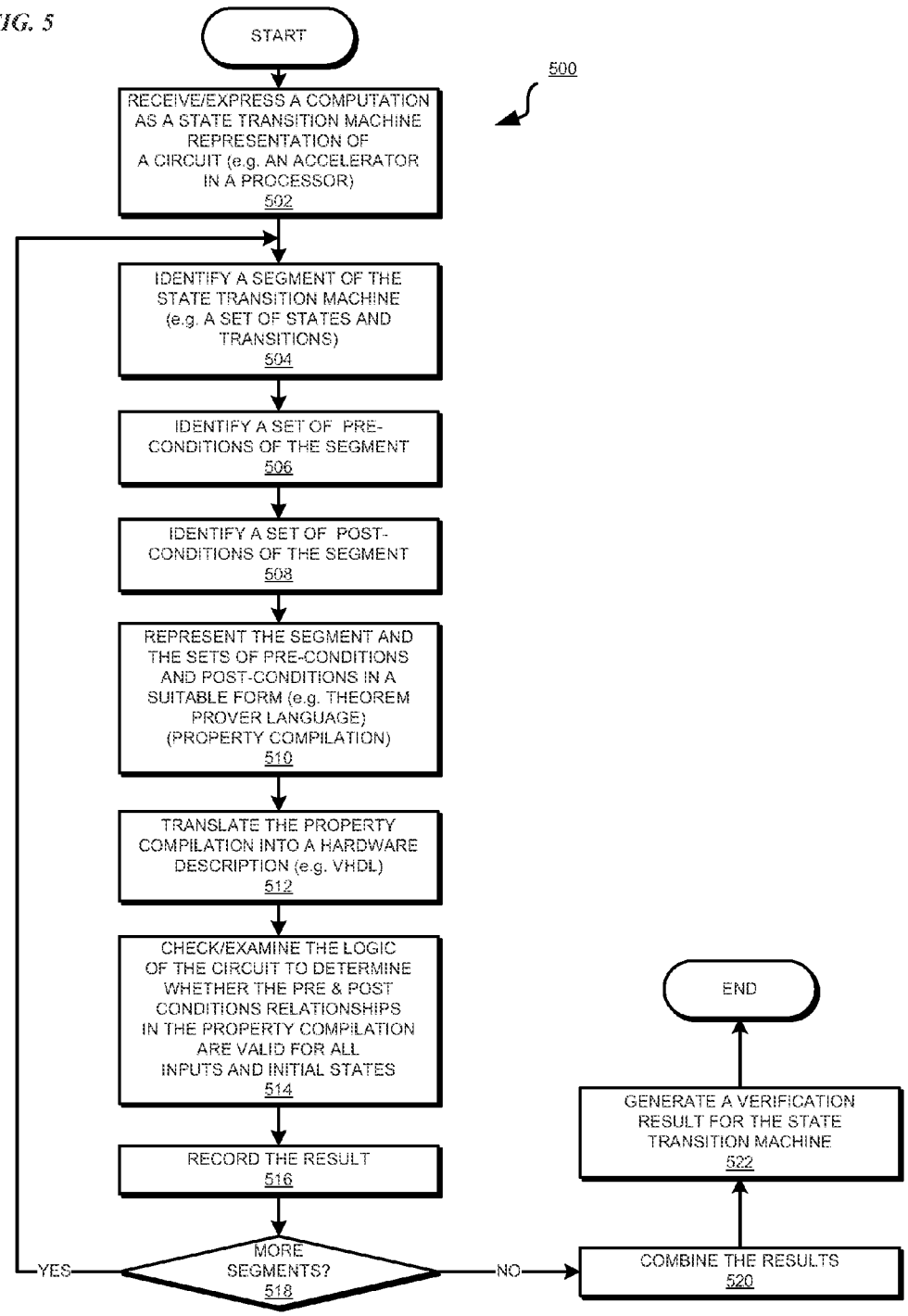

US 8,756,543 B2

VERIFYING DATA INTENSIVE STATE TRANSITION MACHINES RELATED APPLICATION

RELATED APPLICATION

The present invention is related to similar subject matter of co-pending and commonly assigned U.S. patent application Ser. No. 13/097,193 entitled "IMPROVED MODEL CHECKING IN STATE TRANSITION MACHINE VERIFICATION" filed on Apr. 29, 2011, which is hereby incorporated by reference.

BACKGROUND

1. Technical Field

The present invention relates generally to a method, system, and computer program product for creating electronic circuits. More particularly, the present invention relates to a method, system, and computer program product for verifying the operations of a circuit by verifying a state transition machine representation of the circuit.

2. Description of the Related Art

Electronic circuits can be configured to perform mathematical computations. For example, a logic circuit in a microprocessor's integrated circuit may be configured to multiply two integers by manipulating their binary representation in a series of steps according to an algorithm.

Before the circuit can be designed for performing a computation, the series of steps according to a corresponding algorithm are represented in the form of a state transition machine (STM). A state transition machine is also known as a finite state machine, a finite state automaton, or simply a state machine.

An STM includes a set of states. A transition from one state to another state is called a state transition, and occurs in the STM when certain conditions are met. A state can receive an input, and produce an output. The output of one state may be an input for another state. Conditions that exist before a state transition are called pre-conditions. Conditions that exist after a state transition occurs are called post-conditions. For example, an input and pre-conditions trigger the operation of an STM, which performs state transitions according to the conditions configured in the STM, and produces an output and post-conditions.

Operating an STM is the process of supplying the STM an input and a set of pre-conditions, performing state transitions of the STM, and generating an output and post-conditions. Depending on the conditions programmed for the various state transitions, operating an STM can take a significant amount of time. An STM taking several seconds, that is a billion machine cycles or more, to generate an output is not uncommon.

The operation of an STM can be further affected by the size of data used in the operation. For example, where an STM may perform a computation using sixty four bit inputs in a matter of nano-seconds, the same STM may take many seconds to perform the same operation using eight thousand bit inputs.

SUMMARY

The illustrative embodiments provide a method, system, and computer program product for verifying a data intensive state transition machine. An embodiment receives the STM, the STM representing the operation of a circuit configured to perform a computation. The embodiment selects a segment of the STM from a set of segments of the STM. The embodiment determines a set of properties of the segment. The embodiment translates the set of properties into a hardware description to form a translation. The embodiment verifies the segment by verifying whether all relationships between a pre-condition and a post condition in the translation hold true for any set of inputs and any initial state of a hardware design under test. The embodiment generates a verification result for the segment. The embodiment combines verification results for each segment in the set of segments to generate a verification result for the STM.

BRIEF DESCRIPTION OF THE SEVERAL VIEWS OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIG. 5 depicts a flowchart of an example process of verifying data intensive STMs in accordance with an illustrative embodiment.

DETAILED DESCRIPTION

Figure 1:
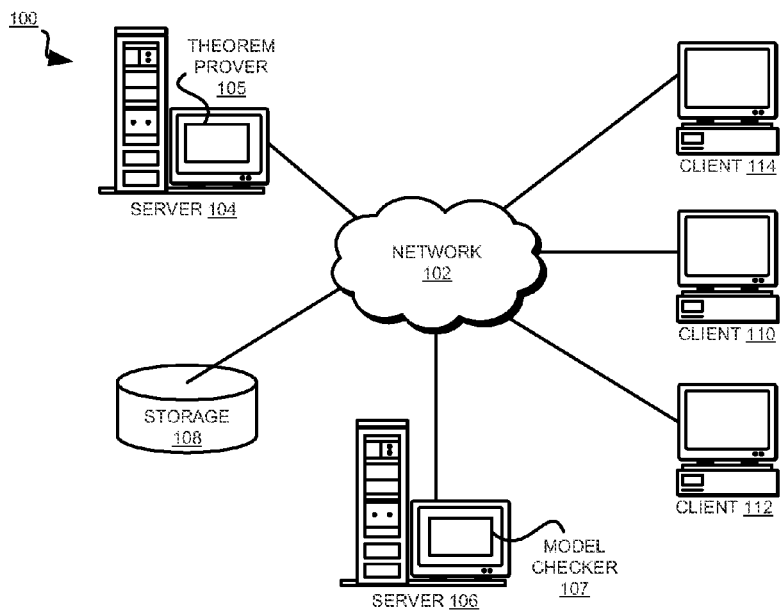
FIG. 1 depicts a pictorial representation of a network of data processing systems in which illustrative embodiments may be implemented.

Before an STM representation of an algorithm can be implemented in a circuit, the STM has to be verified for correct operation under the desired circumstances. For example, an STM may have to be verified for all possible inputs that the circuit will encounter during operation. Verifying the correctness or accuracy of the operation of a given STM under given sets of inputs, pre-conditions, and post-conditions is called the verification problem.

Verification problem is a very difficult problem to solve. As described above, the difficulty arises in part from the time it takes to verify the operation of the STM for each input. Another reason for the verification problem to be so difficult is the fact that in many cases, either all possible inputs cannot be contemplated, or testing for all possible inputs is impractical.

Software simulation of an STM is one method of STM verification. In software simulation, the STM is represented in software code, and the code is executed for various combinations of inputs, pre-conditions, and post-conditions. However, a software simulation is undesirably slow at least for the reasons described above.

Hardware verification of an STM is called post-silicon testing. Post-silicon testing is slow because it inherently depends on software for testing the correctness of the test results generated from the hardware implementation of the STM.

A model checker tests a model of a given system for conformity with a given specification. In other words, a model checker programmatically determines whether the given specification is satisfied by the given system. The model of a system is a representation of the system, such as an STM. The model and the specification are provided to the model checker in a language recognized by the model checker.

The invention recognizes that under certain circumstances, using a model checker to verify an STM suffers from the same problems as software simulation. For example, model checkers are routinely employed to verify STMs that handle data of the order of $2^{100}$, i.e., where the state machine representation handles hundred-bit data. However, when the state machine representation is designed to handle data of the order of $2^{1000}$ or larger, i.e., thousand-bit data or larger, model checking is no longer a viable verification solution due to the time resource requirement of such verification. For example, an STM may have to be verified within a threshold time and the model checker may exceed that threshold in verifying the STM. An STM that handles or manipulates data of a size large enough to cause a model checker or a software simulation to exceed a time threshold during verification of the STM is a data intensive STM.

The illustrative embodiments used to describe the invention generally address and solve the above-described problems and other problems related to verifying STMs. The illustrative embodiments provide a method, system, and computer program product for verifying data intensive STMs. An embodiment combines a theorem prover with a model checker for performing validation of data intensive STMs. Theorem proving is the technique of determining whether a given formula, equation, or theorem is valid for all use cases. A theorem prover is a software implementation for theorem proving. A theorem prover can be used according to an embodiment to test the validity of an equation representation of an STM.

While an example above describes the problem with model checkers with respect to data of the order of $2^{1000}$, that particular size is not intended to imply a limitation on the invention. Generally, an embodiment of the invention is contemplated to be applicable where a given model checker implementation begins to demonstrate undesirable performance.

For example, a prior art model checker implementation may be suitable for verifying state machine representations of the order tens of bits but not for hundreds of bits. An embodiment can be combined with such a model checker to improve verification efficiency for state machine representations of order hundreds of bits within the scope of the invention.

As another example, another prior art model checker implementation may be suitable for verifying state machine representations of the order hundreds of bits but not for thousands of bits. An embodiment can be combined with such a model checker to improve verification efficiency for state machine representations of order thousands of bits within the scope of the invention.

Certain embodiments are described with respect to modulo operation only as an example without implying a limitation on the invention. An embodiment may be used in conjunction with any operation or computation in a similar manner within the scope of the invention. For example, one of ordinary skill in the art will be able to adapt an embodiment describing modulo operation to test an STM for a multiplier. This and other such adaptations are contemplated within the scope of the invention.

The illustrative embodiments are described with respect to certain ICs or circuits only as examples. Such descriptions are not intended to be limiting on the invention. For example, an illustrative embodiment described with respect to a microprocessor can be implemented with respect to a logic circuit without departing the scope of the invention.

The illustrative embodiments are described with respect to certain data, data structures, file-systems, file names, directories, and paths only as examples. Such descriptions are not intended to be limiting on the invention. For example, an illustrative embodiment when described with respect to a table and path can be implemented as a flat file, an index file, or a database within the scope of the invention.

Furthermore, the illustrative embodiments may be implemented with respect to any type of data, data source, or access to a data source over a data network. Any type of data storage device may provide the data to an embodiment of the invention, either locally at a data processing system or over a data network, within the scope of the invention.

The illustrative embodiments are described using specific code, designs, architectures, layouts, schematics, and tools only as examples and are not limiting on the illustrative embodiments. Furthermore, the illustrative embodiments are described in some instances using particular software, tools, and data processing environments only as an example for the clarity of the description. The illustrative embodiments may be used in conjunction with other comparable or similarly purposed structures, systems, applications, or architectures. An illustrative embodiment may be implemented in hardware, software, or a combination thereof.

The examples in this disclosure are used only for the clarity of the description and are not limiting on the illustrative embodiments. Additional data, parameters, considerations, operations, actions, tasks, activities, and manipulations will be conceivable from this disclosure and the same are contemplated within the scope of the illustrative embodiments.

Any advantages listed herein are only examples and are not intended to be limiting on the illustrative embodiments. Additional or different advantages may be realized by specific illustrative embodiments. Furthermore, a particular illustrative embodiment may have some, all, or none of the advantages listed above.

Figure 2:
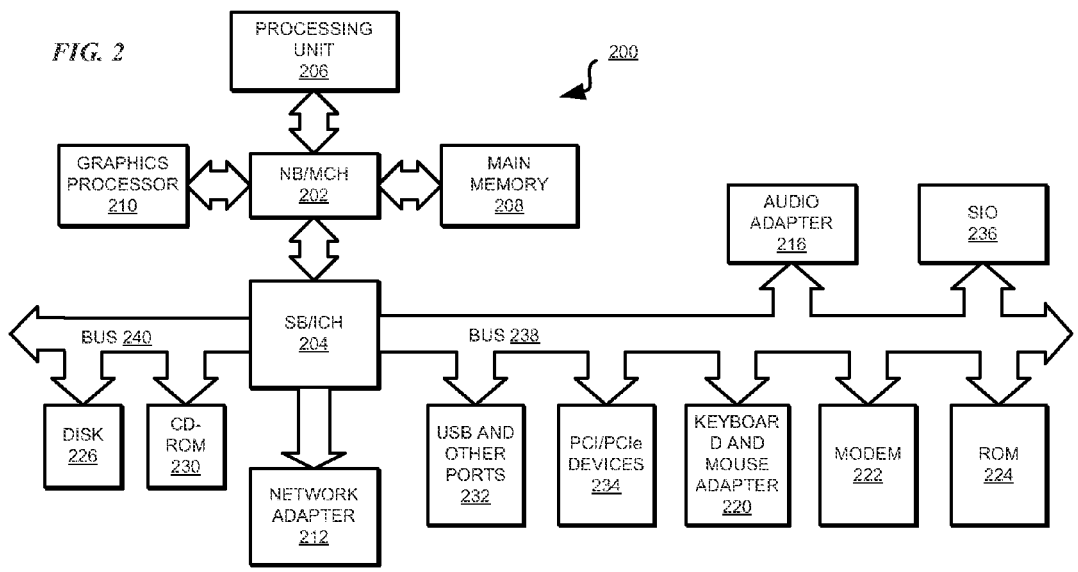
FIG. 2 depicts a block diagram of a data processing system in which illustrative embodiments may be implemented.

With reference to the figures and in particular with reference to FIGS. 1 and 2, these figures are example diagrams of data processing environments in which illustrative embodiments may be implemented. FIGS. 1 and 2 are only examples and are not intended to assert or imply any limitation with regard to the environments in which different embodiments may be implemented. A particular implementation may make many modifications to the depicted environments based on the following description.

FIG. 1 depicts a pictorial representation of a network of data processing systems in which illustrative embodiments may be implemented. Data processing environment 100 is a network of computers in which the illustrative embodiments may be implemented. Data processing environment 100 includes network 102. Network 102 is the medium used to provide communications links between various devices and computers connected together within data processing environment 100. Network 102 may include connections, such as wire, wireless communication links, or fiber optic cables. Server 104 and server 106 couple to network 102 along with storage unit 108. Software applications may execute on any computer in data processing environment 100.

In addition, clients 110, 112, and 114 couple to network 102. A data processing system, such as server 104 or 106, or client 110, 112, or 114 may contain data and may have software applications or software tools executing thereon.

Any data processing system, such as server 104, may include theorem prover 105. Model checker 107 may execute in server 106 or elsewhere in data processing environment 100, such that theorem prover 105 can interact with model checker 107 in the manner of an illustrative embodiment. In an embodiment, theorem prover 105 and model checker 107 may execute in a common data processing system, such as server 104.

Servers 104 and 106, storage unit 108, and clients 110, 112, and 114 may couple to network 102 using wired connections, wireless communication protocols, or other suitable data connectivity. Clients 110, 112, and 114 may be, for example, personal computers or network computers.

In the depicted example, server 104 may provide data, such as boot files, operating system images, and applications to clients 110, 112, and 114. Clients 110, 112, and 114 may be clients to server 104 in this example. Clients 110, 112, 114, or some combination thereof, may include their own data, boot files, operating system images, and applications. Data processing environment 100 may include additional servers, clients, and other devices that are not shown.

In the depicted example, data processing environment 100 may be the Internet. Network 102 may represent a collection of networks and gateways that use the Transmission Control Protocol/Internet Protocol (TCP/IP) and other protocols to communicate with one another. At the heart of the Internet is a backbone of data communication links between major nodes or host computers, including thousands of commercial, governmental, educational, and other computer systems that route data and messages. Of course, data processing environment 100 also may be implemented as a number of different types of networks, such as for example, an intranet, a local area network (LAN), or a wide area network (WAN). FIG. 1 is intended as an example, and not as an architectural limitation for the different illustrative embodiments.

Among other uses, data processing environment 100 may be used for implementing a client-server environment in which the illustrative embodiments may be implemented. A client-server environment enables software applications and data to be distributed across a network such that an application functions by using the interactivity between a client data processing system and a server data processing system. Data processing environment 100 may also employ a service oriented architecture where interoperable software components distributed across a network may be packaged together as coherent business applications.

With reference to FIG. 2, this figure depicts a block diagram of a data processing system in which illustrative embodiments may be implemented. Data processing system 200 is an example of a computer, such as server 104 or client 110 in FIG. 1, in which computer usable program code or instructions implementing the processes of the illustrative embodiments may be located for the illustrative embodiments.

In the depicted example, data processing system 200 employs a hub architecture including North Bridge and memory controller hub (NB/MCH) 202 and south bridge and input/output (I/O) controller hub (SB/ICH) 204. Processing unit 206, main memory 208, and graphics processor 210 are coupled to north bridge and memory controller hub (NB/MCH) 202. Processing unit 206 may contain one or more processors and may be implemented using one or more heterogeneous processor systems. Graphics processor 210 may be coupled to the NB/MCH through an accelerated graphics port (AGP) in certain implementations.

In the depicted example, local area network (LAN) adapter 212 is coupled to south bridge and I/O controller hub (SB/ICH) 204. Audio adapter 216, keyboard and mouse adapter 220, modem 222, read only memory (ROM) 224, universal serial bus (USB) and other ports 232, and PCI/PCIe devices 234 are coupled to south bridge and I/O controller hub 204 through bus 238. Hard disk drive (HDD) 226 and CD-ROM 230 are coupled to south bridge and I/O controller hub 204 through bus 240. PCI/PCIe devices may include, for example, Ethernet adapters, add-in cards, and PC cards for notebook computers. PCI uses a card bus controller, while PCIe does not. ROM 224 may be, for example, a flash binary input/output system (BIOS). Hard disk drive 226 and CD-ROM 230 may use, for example, an integrated drive electronics (IDE) or serial advanced technology attachment (SATA) interface. A super I/O (SIO) device 236 may be coupled to south bridge and I/O controller hub (SB/ICH) 204.

An operating system runs on processing unit 206. The operating system coordinates and provides control of various components within data processing system 200 in FIG. 2. The operating system may be a commercially available operating system such as Microsoft® Windows® (Microsoft and Windows are trademarks of Microsoft Corporation in the United States, other countries, or both), or Linux® (Linux is a trademark of Linus Torvalds in the United States, other countries, or both). An object oriented programming system, such as the Java™ programming system, may run in conjunction with the operating system and provides calls to the operating system from Java™ programs or applications executing on data processing system 200 (Java and all Java-based trademarks and logos are trademarks or registered trademarks of Oracle and/or its affiliates).

Program instructions for the operating system, the object-oriented programming system, the processes of the illustrative embodiments, and applications or programs are located on storage devices, such as hard disk drive 226, and may be loaded into a memory, such as, for example, main memory 208, read only memory 224, or one or more peripheral devices, for execution by processing unit 206. Program instructions may also be stored permanently in non-volatile memory and either loaded from there or executed in place. For example, the synthesized program according to an embodiment can be stored in non-volatile memory and loaded from there into DRAM.

The hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. In addition, the processes of the illustrative embodiments may be applied to a multiprocessor data processing system.

In some illustrative examples, data processing system 200 may be a personal digital assistant (PDA), which is generally configured with flash memory to provide non-volatile memory for storing operating system files and/or user-generated data. A bus system may comprise one or more buses, such as a system bus, an I/O bus, and a PCI bus. Of course, the bus system may be implemented using any type of communications fabric or architecture that provides for a transfer of data between different components or devices attached to the fabric or architecture.

A communications unit may include one or more devices used to transmit and receive data, such as a modem or a network adapter. A memory may be, for example, main memory 208 or a cache, such as the cache found in north bridge and memory controller hub 202. A processing unit may include one or more processors or CPUs.

The depicted examples in FIGS. 1-2 and above-described examples are not meant to imply architectural limitations. For example, data processing system 200 also may be a tablet computer, laptop computer, or telephone device in addition to taking the form of a PDA.

In accordance with an illustrative embodiment, an STM can be verified by a hybrid system combining a model checker and a theorem prover. An embodiment verifies an STM by first using a theorem prover to segment the STM into smaller segments of one or more state transitions. A segment is a portion of an STM and includes one or more state transitions and the states that participate in those one or more state transitions. An embodiment then uses a model checker to verify the specified property of the STM for every state transition in each segment. An embodiment then uses the theorem prover to combine the model checker results for each segment. An embodiment then generates a verification result for the whole STM.

An embodiment further uses an induction scheme in the model checker to improve the process of verifying property for a state transition. An embodiment thus improves a model checker and enables the improved model checker to perform the verification process more efficiently than a prior art model checker.

As an example, consider an STM that transits from state $S_0$ to $S_2$, $S_2$ and so on. A state transition in this example STM may take more than a single clock cycle of a data processing system being verified. Assume it takes $\Delta$ cycles for the example STM to transition from state $S_i$ to $S_{i+1}$.

Now, assume that some property has to be checked for each state. For example, an embodiment has to verify that a property $P_0$ holds for $S_0$, $P_1$ holds for $S_1$, $P_2$ holds for $S_2$, and so on. The expression $P_i(S_i)$ to indicate that property $P_i$ holds for state $S_i$. Such properties are often represented as a combinational circuit with registers.

An embodiment uses a model checker to verify that, if a property holds for the starting state in a segment of the STM, then another property holds for the finishing state. For example, if the segment includes states $S_0$ and $S_2$, the embodiment verifies using the model checker that if property $P_0$ holds for the starting state $S_0$, then whether property $P_1$ holds for $S_1$. This verification can be expressed as implication $(P_0(S_0) \Rightarrow P_1(S_1))$.

Similarly, the embodiment can also verify implication $(P_1(S_1) \Rightarrow P_2(S_2))$. The embodiment then combines the two implications to conclude $(P_0(S_0) \Rightarrow P_2(S_2))$.

In general, if the embodiment can verify the implication $(P_i(S_i) \Rightarrow P_{i+1}(S_{i+1}))$, and also that a property holds for the initial state, such as $P_0(S_0)$, the embodiment can conclude that $P_{final}(S_{final})$ is valid for the final state $S_{final}$, thereby verifying the correctness of the STM. Thus, the verification problem to be solved is reduced to proving $P_i(S_i) \Rightarrow P_{i+1}(S_{i+1})$ according to the embodiment.

Henceforth in this example, the notation $P_i(n)$ indicates that $P_i(S_i)$ holds at machine cycle n. Since the transition from $S_i$ to $S_{i+1}$ takes $\Delta$ cycles, the implication that the embodiment is trying to prove can be written as $(P_i(n) \Rightarrow P_{i+1}(n+\Delta))$.

Notation $Q(n)$ represents $(P_i(n) \Rightarrow P_{i+1}(n+\Delta))$. The embodiment proves $Q(n)$ by the following steps, some of which may be optional steps or alternatives in certain implementations—

Convert $Q(n)$ to a circuit using logical gates and latches. Since $P(n)$ is represented as a combinational circuit, we can latch the value of $P(n)$ for the $\Delta$ cycles that are needed for the state transition, and then check the latched value of $P(n)$ implies $P(n+\Delta)$.

Simplify $Q(n)$ using a number of circuit reduction techniques, such as constant propagation, SAT sweeping, retiming, and transient value elimination. This reduction may reduce $Q(n)$ to 1, in such a case $Q(n)$ is proven to be correct, and the proof according to the embodiment stops.

Otherwise, the embodiment proceeds to the next step. Prove $Q(n)$ by induction over clock cycle n. This step is done by proving the base case $Q(0)$ and the induction step $Q(n) \Rightarrow Q(n+1)$.

The embodiment may be configured to use an extended format of induction, called k-induction. Using k-induction, the embodiment proves $Q(n)$ by proving k base cases $Q(0)$, $Q(1)$, ... $Q(k-1)$, and also proving the induction step $Q(n)$ & $Q(n+1)$ & ... & $Q(n+k-1) \Rightarrow Q(n+k)$.

The induction over clock cycle is just one example model checking algorithm described for the clarity of the disclosure and is not intended to be limiting on the invention. Any model checking algorithm can be used in a similar manner without departing the scope of the invention. For example, another major algorithm usable for this purpose is fix-point calculation using a binary-decision diagram or a satisfiability checker (SAT). Any model checking algorithm can be used as long as the pre-condition implies post-condition for any inputs and initial states, and such algorithm can be combined with a theorem prover in the manner of an embodiment.

These operations are explained below using modulo operation as an example. Modulo operation computes the remainder in a division. For example, 5 divided by 3 leaves a remainder of 2. Thus, 5 modulo 3 is 2, which is expressed as 5 mod 3=2.

Figure 3:
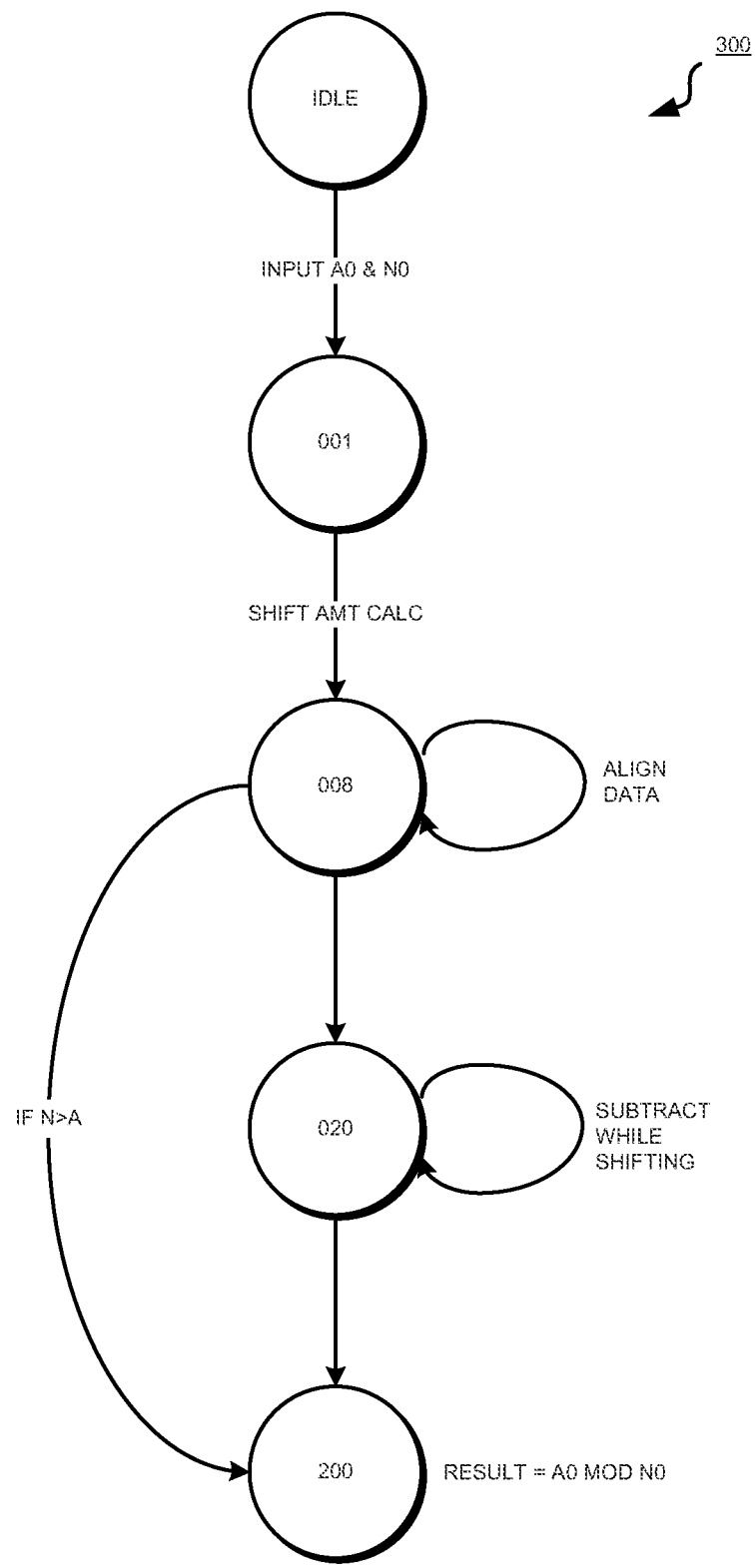
FIG. 3 depicts a diagram of an STM representing a modulo operation, which can be verified using an illustrative embodiment.

With reference to FIG. 3, this figure depicts a diagram of an STM representing a modulo operation, which can be verified using an illustrative embodiment. The illustrative embodiment may verify the depicted STM using a combination of theorem prover 105 and model checker 107 in FIG. 1.

STM 300 includes states labeled "idle", "001", "008", "020", and "200". State "idle" is the initial state and state "200" is the final state. STM 300 is configured to compute A0 mod N0.

STM 300 transitions from idle to 001 when inputs A0 and N0 are received. A0 and N0 are the initial values stored in register A and register N respectively. STM 300 transitions from 001 to 008 by computing a shift amount. Particularly, the transition 001-008 occurs when a difference between the number of leading zeros in N0 (expressed as lz(N0)) and the number of leading zeros in A0 (expressed as lz(A0)) is calculated and stored. For example, register C stores the value lz(N0)−lz(A0), and register D stores the value of register C. the next state register S identifies state 008 as the next state. In other words, at state 001:

$C = lz(N0) - lz(A0)$, $D = C$, and $S = 008$

By using similar expressions, at state 008:

```
if (D < 0)
        {S = 200;}
else if (D = 0)
        {S = 020;
         D = C;}
else
        {N = N << 1; //N bit shifted left by 1
         D = D - 1;
         S = 008;}
```

At state 020:

```
if(D > 0 && A >= 0)
    {A = A - N;
    N = N >> 1; //N bit shifted right by 1
    D = D - 1;
    S = 020;}
else if (D > 0 && A < 0)
    {A = A + N;
    N = N >> 1;
    D = D - 1;
    S = 020;}
else if (D = 0 && A >= 0)
    {A = A - N;
    D = D - 1;
    S = 020;}
else if (D = 0 && A < 0)
    {A = A + N;
    D = D - 1;
    S = 020;}
else if (D < 0 && A > N)
    {A = A - N;
    S = 200}
else if (D < 0 && A < 0)
    {A = A + N;
    S = 200;}
else
    {S = 200;}
```

The following table illustrates the contents of the various registers as STM 300 computes an example 5 mod 3=2. The state column shows the state in which the STM is when the contents of registers A, N, C, and D are as shown in a particular row. The content values are Binary as indicated by values with subscript 2. Register A holds the initial value 5 and the final value (answer) 2 ($0010_2$).

TABLE 1

Value of registers A, N, C, and D
for computing 5 mod 3 using STM 300 in FIG. 3.

| State | A | N | C | D |
|---|---|---|---|---|
| 001 | 5 = $0101_2$ | 3 = $0011_2$ | — | — |
| 008 | 5 = $0101_2$ | 3 = $0011_2$ | 1 | 1 |
| 008 | 5 = $0101_2$ | 6 = $0110_2$ | 1 | 0 |
| 020 | 5 = $0101_2$ | 6 = $0110_2$ | 1 | 1 |
| 020 | −1 = $1111_2$ | 3 = $0011_2$ | 1 | 0 |
| 020 | 2 = $0010_2$ | 3 = $0011_2$ | 1 | −1 |
| 200 | 2 = $0010_2$ | 3 = $0011_2$ | 1 | −1 |

Figure 4:
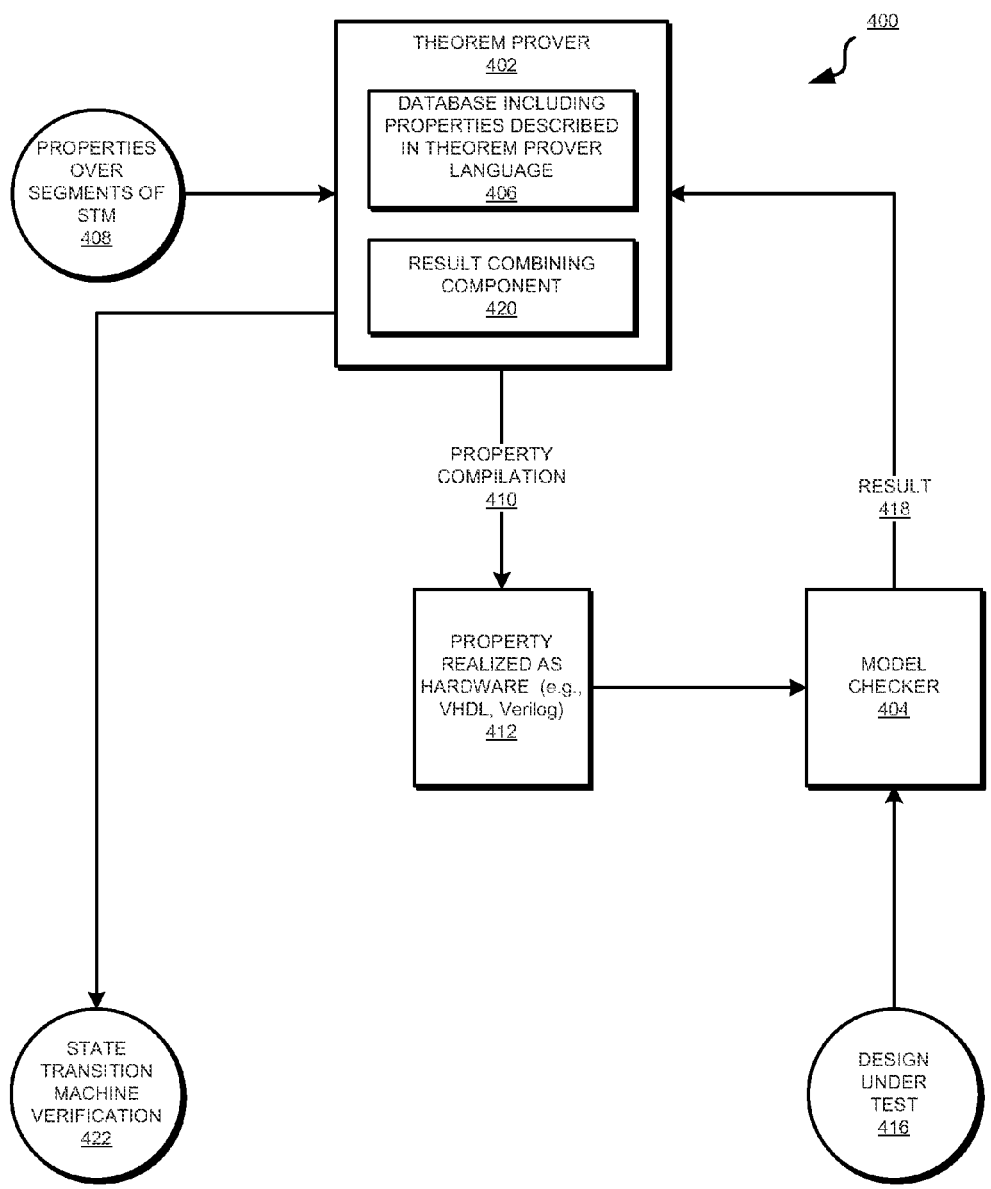
FIG. 4 depicts a block diagram of a combination of a theorem prover and a model checker usable for verifying a data intensive STM in accordance with an illustrative embodiment.

With reference to FIG. 4, this figure depicts a block diagram of a combination of a theorem prover and a model checker usable for verifying a data intensive STM in accordance with an illustrative embodiment. Verification configuration 400 includes theorem prover 402, which may be implemented using theorem prover 105 in FIG. 1, and model checker 404, which may be implemented using model checker 107 in FIG. 1.

Theorem prover 402 receives a set of properties over segments of an STM. A segment includes a starting state, a finishing state, and the transition there-between according to the STM of input 408. A property over a segment of the STM includes a pre-condition that is supposed to hold for the starting state, and a post-condition that is supposed to hold for the finishing state. Such a property is described in a theorem prover's language and stored in the theorem prover's database 406.

The property in the theorem prover language stored in the database 406 is translated in the property compilation process 410. The property compilation produces the equivalent property realized as hardware description 412. This hardware description of the property computes whether the property holds, and if it holds, the circuit outputs a predetermined value, e.g., 1. Otherwise it produces another predetermined value, e.g., 0. Such hardware description can be used to describe the relation of the pre-condition of the starting state and the post-condition of the finishing state of a segment of STM. This new form of the property implemented as a circuit is often described in VHDL, Verilog or other hardware description languages, or may be described in an hardware description format specific to the verification program.

Property realized as a hardware circuit 412 of the segment is sent to model checker 404. Model checker 404 combines property 412 with design under test 416. Model checker 404 examines the logic for any set of inputs and initial states, and checks whether the specified pre-condition and post-condition relationships always hold for all inputs in the set for design 416. Design 416 may be a design of a circuit that is intended to operate according to the STM of input 408.

When the model checker 404 combines property 412 with the hardware design under test 416, it creates a configuration to test, whenever the design under test 416 exhibits the pre-condition at some clock cycle, the design under test 416 exhibits the post-condition at x cycles later. The pre-condition and post condition relationship is checked and proved for every clock cycle. For example, relationship $P_i(S_i) \rightarrow P_j(S_j)$ may involve x cycles long transition, e.g., from cycle n to cycle n+x, where n can be any particular cycle. The induction check ensures that regardless of at which cycle the state transition actually happens, the relationship between the specified pre-condition and post-condition always hold.

Model checker 404 provides result 418 generated from the examination and checking to theorem prover 402. Result 418 may be recorded by theorem prover 402 in database 406 until a later time when results for other segments of the STM of input 408 are also available. Result combining component 420 in theorem prover 402 combines the results of the various segments of the STM of input 408. Theorem prover 402 determines from combining the results whether design under test 416 correctly implements the STM of input 408 and operates as desired for all inputs. Theorem prover 402 outputs verification 422 of the STM of input 408 accordingly.

The embodiment depicted in FIG. 4 can be used for verifying any STM generally, and data intensive STMs particularly. For example, the embodiment can be used to verify STM 300 shown in FIG. 3.

For example, STM 300 in FIG. 3 can be divided into a set of segments. That is, one segment starting from state "IDLE" and ending with state "001", another segment starting from state "001" and ending with state "008", another segment from state "008" to state "200", another segment from "008" to "008" itself, another segment from "008" to "020", another segment from "020" to "020" itself, and another segment from "020" to "200". Examples of the pre-conditions and the post-conditions are shown in the table below.

TABLE 2

Pre-conditions and post-conditions
for various segments of STM 300 in FIG. 3.

| State transition | pre-condition | post-condition |
|---|---|---|
| State "IDLE" to State "001" | S = "IDLE" | S' = "001" & A' = A0 & N' = N0 |

TABLE 2-continued

Pre-conditions and post-conditions
for various segments of STM 300 in FIG. 3.

| State transition | pre-condition | post-condition |
| --- | --- | --- |
| State "001" to State "008" | S = "001" | S' = "008" & C' = lz(N) – lz(A) & D' = C' & A' = A & N' = N |
| State "008" to State "200" | S = "008" & D < 0 | S' = "200" & A = A' |

A theorem prover can prove that after two state transitions, S="008" and A=A0.

With reference to FIG. 5, this figure depicts a flowchart of an example process of verifying data intensive STMs in accordance with an illustrative embodiment. Process 500 may be implemented in verification configuration 400 in FIG. 4.

Process 500 begins by expressing a desired computation as an STM representation of a circuit, or receiving such an expression (step 502). As an example, the computation may be a modulo computation and the circuit may be an accelerator of any type for accelerating any computation in a microprocessor.

Process 500 identifies a segment of the STM, e.g., a set of states and associated transitions in the STM (step 504). Process 500 identifies a set of pre-conditions for the segment (step 506). Process 500 identifies a set of post-conditions for the segment (step 508).

Process 500 represents the segment and the sets of pre-conditions and post-conditions in a suitable form as a compilation of properties (step 510). For example, process 500 may perform the representation of step 510 using a suitable theorem prover language.

Process 500 translates the property compilation of step 510 into a hardware description, such as by using a hardware description language (step 512). In one embodiment, the hardware description language may be human readable, such as VHDL. In another embodiment, the translation may occur within a memory, may be stored in a data structure in the memory, and may not be output in a human readable form.

Process 500 checks/examines the logic of the circuit described by the hardware description to determine whether the relationships between the pre-conditions and post-conditions in the property compilation are valid for all inputs and initial states of the hardware design under test (step 514). Process 500 records the results of the checking of step 514 (step 516).

Process 500 determines whether more segments of the STM of step 502 have to be checked (step 518). If more segments have to checked ("Yes" path of step 518), process 500 returns to step 504 and identifies another segment.

If no more segments are to be checked ("No" path of step 518), process 500 combines the results obtained in step 516 for the various segments (step 520). Process 500 generates a verification result for the STM of step 502 (step 522). Process 500 ends thereafter.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Thus, a computer implemented method, system, and computer program product are provided in the illustrative embodiments for verification of data intensive STMs. Using an embodiment of the invention, an STM whose verification may be undesirably inefficient or not possible using a prior art model checker or software simulation can be verified efficiently. An embodiment enables verifying the properties over longer state transitions, more complex STMs, or a combination thereof, as compared to the presently available methods of STM verification.

The invention offers a new method, computer usable program product, and data processing system that combines model checking and theorem proving concepts to solve the problem of verifying STMs. The methodology of an embodiment decomposes an STM, for each state transition, the embodiment proves certain properties, and the embodiment then combine the proofs of portions of the STM together to achieve a verification of the entire STM.

Combinations of model checkers and theorem provers that have been used in the prior art are not usable for STM verification and are not configured in the manner of an embodiment. Some model checker check implications in a general sense by checking trajectory assertions A=>C, but in such checking, A and C are not properties in the manner described herein. None of the prior art combinations of a model checker and a theorem prover verifies a data intensive STM, which consumes thousands of cycles of execution, by decomposing the STM into segments in the manner described herein. Further, as an example, none of the prior art combinations of a model checker and a theorem prover verify a data intensive STM for performing modulo operation in the manner described herein.

Some embodiments have been described with respect to modulo computation only as an example. Many types of operations, computations, or data manipulations that can be represented as an STM will be apparent from this disclosure to those of ordinary skill in the art and the same are contemplated within the scope of the invention.

As will be appreciated by one skilled in the art, aspects of the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable storage device(s) or computer readable media having computer readable program code embodied thereon.

Any combination of one or more computer readable storage device(s) or computer readable media may be utilized. The computer readable medium may be a computer readable signal medium or a computer readable storage medium. A computer readable storage device may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage device would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage device may be any tangible device or medium that can contain, or store a program for use by or in connection with an instruction execution system, apparatus, or device.

Program code embodied on a computer readable storage device or computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to one or more processors of one or more general purpose computers, special purpose computers, or other programmable data processing apparatuses to produce a machine, such that the instructions, which execute via the one or more processors of the computers or other programmable data processing apparatuses, create means for implementing the functions/acts specified in the flowchart and/or block diagram block or blocks.

These computer program instructions may also be stored in one or more computer readable storage devices or computer readable media that can direct one or more computers, one or more other programmable data processing apparatuses, or one or more other devices to function in a particular manner, such that the instructions stored in the one or more computer readable storage devices or computer readable medium produce an article of manufacture including instructions which implement the function/act specified in the flowchart and/or block diagram block or blocks.

The computer program instructions may also be loaded onto one or more computers, one or more other programmable data processing apparatuses, or one or more other devices to cause a series of operational steps to be performed on the one or more computers, one or more other programmable data processing apparatuses, or one or more other devices to produce a computer implemented process such that the instructions which execute on the one or more computers, one or more other programmable data processing apparatuses, or one or more other devices provide processes for implementing the functions/acts specified in the flowchart and/or block diagram block or blocks.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A computer implemented method for verifying a state transition machine (STM), the method comprising:
   receiving the STM, the STM representing the operation of a circuit configured to perform a computation;
   selecting a segment of the STM from a set of segments of the STM;
   determining a set of properties of the segment;
   translating the set of properties into a hardware description to form a translation such that when a property holds according to the hardware description, a circuit corresponding to the hardware description outputs a predetermined value, and when the property does not hold according to the hardware description, the circuit outputs a second predetermined value;
   verifying, using a processor and a memory, the segment by verifying whether all relationships between a pre-condition and a post condition in the translation hold true for any set of inputs and any initial state of a hardware design under test;
   generating a verification result for the segment; and
   combining verification results for each segment in the set of segments to generate a verification result for the STM.

2. The computer implemented method of claim 1, wherein the combining the verification results for each segment in the set of segments of the STM occurs in a theorem prover, further comprising:
   segmenting the STM into the set of segments using a language of the theorem prover.

3. The computer implemented method of claim 1, wherein the STM comprises a set of states and a set of transitions, and wherein a segment in the set of segments comprises:
  a starting state from the set of states;
  a finishing state from the set of states; and
  a transition from the starting state and the finishing state.

4. The computer implemented method of claim 1, wherein the set of properties includes:
  a set of pre-conditions associated with the transition in the segment; and
  a set of post-conditions associated with the transition in the segment, wherein the pre-condition is at a starting state of the segment, and the post-condition is at a finishing state of the segment.

5. The computer implemented method of claim 1, further comprising:
  compiling the set of properties using a theorem prover language, and wherein the translating translates from the theorem prover language to the hardware description language.

6. The computer implemented method of claim 1, wherein the translation is in VHDL.

7. The computer implemented method of claim 1, wherein when the hardware design under test exhibits the pre-condition at a given clock cycle, the hardware design under test exhibits the post-condition after a number of clock cycles, and wherein the verifying is performed using a model checker, wherein the STM is a data intensive STM, wherein the data intensive STM manipulates data of a length, and wherein the model checker consumes time exceeding a threshold when used to verify the STM.

8. The computer implemented method of claim 7, wherein the length is at least one thousand bits.

9. The computer implemented method of claim 1, wherein the STM represents a modulo operation.

10. A computer usable program product comprising a non-transitory computer usable storage medium including computer usable code for verifying a state transition machine (STM), the computer usable code comprising:
  computer usable code for receiving the STM, the STM representing the operation of a circuit configured to perform a computation;
  computer usable code for selecting a segment of the STM from a set of segments of the STM;
  computer usable code for determining a set of properties of the segment;
  computer usable code for translating the set of properties into a hardware description to form a translation such that when a property holds according to the hardware description, a circuit corresponding to the hardware description outputs a predetermined value, and when the property does not hold according to the hardware description, the circuit outputs a second predetermined value;
  computer usable code for verifying the segment by verifying whether all relationships between a pre-condition and a post condition in the translation hold true for any set of inputs and any initial state of a hardware design under test;
  computer usable code for generating a verification result for the segment; and
  computer usable code for combining verification results for each segment in the set of segments to generate a verification result for the STM.

11. The computer usable program product of claim 10, wherein the combining the verification results for each segment in the set of segments of the STM occurs in a theorem prover, further comprising:
  computer usable code for segmenting the STM into the set of segments using a language of the theorem prover.

12. The computer usable program product of claim 10, wherein the STM comprises a set of states and a set of transitions, and wherein a segment in the set of segments comprises:
  a starting state from the set of states;
  a finishing state from the set of states; and
  a transition from the starting state and the finishing state.

13. The computer usable program product of claim 10, wherein the set of properties includes:
  a set of pre-conditions associated with the transition in the segment; and
  a set of post-conditions associated with the transition in the segment, wherein the pre-condition is at a starting state of the segment, and the post-condition is at a finishing state of the segment.

14. The computer usable program product of claim 10, further comprising:
  computer usable code for compiling the set of properties using a theorem prover language, and wherein the translating translates from the theorem prover language to the hardware description language.

15. The computer usable program product of claim 10, wherein the translation is in VHDL.

16. The computer usable program product of claim 10, wherein when the hardware design under test exhibits the pre-condition at a given clock cycle, the hardware design under test exhibits the post-condition after a number of clock cycles, and wherein the verifying is performed using a model checker, wherein the STM is a data intensive STM, wherein the data intensive STM manipulates data of a length, and wherein the model checker consumes time exceeding a threshold when used to verify the STM.

17. The computer usable program product of claim 16, wherein the length is at least one thousand bits.

18. The computer usable program product of claim 10, wherein the computer usable code is stored in a computer readable storage medium in a data processing system, and wherein the computer usable code is transferred over a network from a remote data processing system.

19. The computer usable program product of claim 10, wherein the computer usable code is stored in a computer readable storage medium in a server data processing system, and wherein the computer usable code is downloaded over a network to a remote data processing system for use in a computer readable storage medium associated with the remote data processing system.

20. A data processing system for verifying a state transition machine (STM), the data processing system comprising:
  a non-transitory storage device, wherein the storage device stores computer usable program code; and
  a processor, wherein the processor executes the computer usable program code, and wherein the computer usable program code comprises:
  computer usable code for receiving the STM, the STM representing the operation of a circuit configured to perform a computation;
  computer usable code for selecting a segment of the STM from a set of segments of the STM;
  computer usable code for determining a set of properties of the segment;

computer usable code for translating the set of properties into a hardware description to form a translation such that when a property holds according to the hardware description, a circuit corresponding to the hardware description outputs a predetermined value, and when the property does not hold according to the hardware description, the circuit outputs a second predetermined value;

computer usable code for verifying the segment by verifying whether all relationships between a pre-condition and a post condition in the translation hold true for any set of inputs and any initial state of a hardware design under test;

computer usable code for generating a verification result for the segment; and computer usable code for combining verification results for each segment in the set of segments to generate a verification result for the STM.

* * * * *